(12) United States Patent
Mahoney et al.

(10) Patent No.: US 12,727,100 B2
(45) Date of Patent: Sep. 1, 2026

(54) HINGED HOUSING INCLUDING A HINGE RETENTION MECHANISM

(71) Applicant: Applied Optoelectronics, Inc., Sugar Land, TX (US)

(72) Inventors: William G. Mahoney, Suwanee, GA (US); Brendan Stringer, Woodstock, GA (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 342 days.

(21) Appl. No.: 18/377,165

(22) Filed: Oct. 5, 2023

(65) Prior Publication Data

US 2025/0120025 A1 Apr. 10, 2025

(51) Int. Cl.
*H05K 5/02* (2006.01)
*H05K 5/03* (2006.01)

(52) U.S. Cl.
CPC ............. *H05K 5/0226* (2013.01); *H05K 5/03* (2013.01)

(58) Field of Classification Search
CPC ........... H05K 5/0226; H05K 5/03; H05K 5/02
See application file for complete search history.

(56) References Cited

U.S. PATENT DOCUMENTS 6,354,461 B1 * 3/2002 Tenney .................... H05K 5/13
220/4.23

* cited by examiner

*Primary Examiner* — Jerry Wu
(74) *Attorney, Agent, or Firm* — Secant IP, P.L.L.C.

(57) ABSTRACT

A hinged housing with a hinge retention mechanism may be used to house electronic equipment such as an RF amplifier in a hybrid fiber-coaxial (HFC) network delivering CATV services to subscriber locations. The hinged housing includes housing portions that may be separated by uncoupling hinge members forming one or more hinges, for example, to replace or repair the electronic equipment. The hinge retention mechanism prevents inadvertent uncoupling of the hinge members and separation of the housing portions. The hinge retention mechanism is retractable and push-activated to allow the hinge members to uncouple while the retention mechanism remains secured to one of the housing portions. In one embodiment, the retention mechanism may be provided on a replacement lid assembly of an electronic equipment housing (e.g., an RF amplifier housing), which is designed to replace a lid assembly on an existing housing in the field.

7 Claims, 8 Drawing Sheets

132
136
140
112
110

132
136
140
112
110

120
122
134
136
142
112
140
144
110

143

4A
130
2
4
135
133
132

5A
6

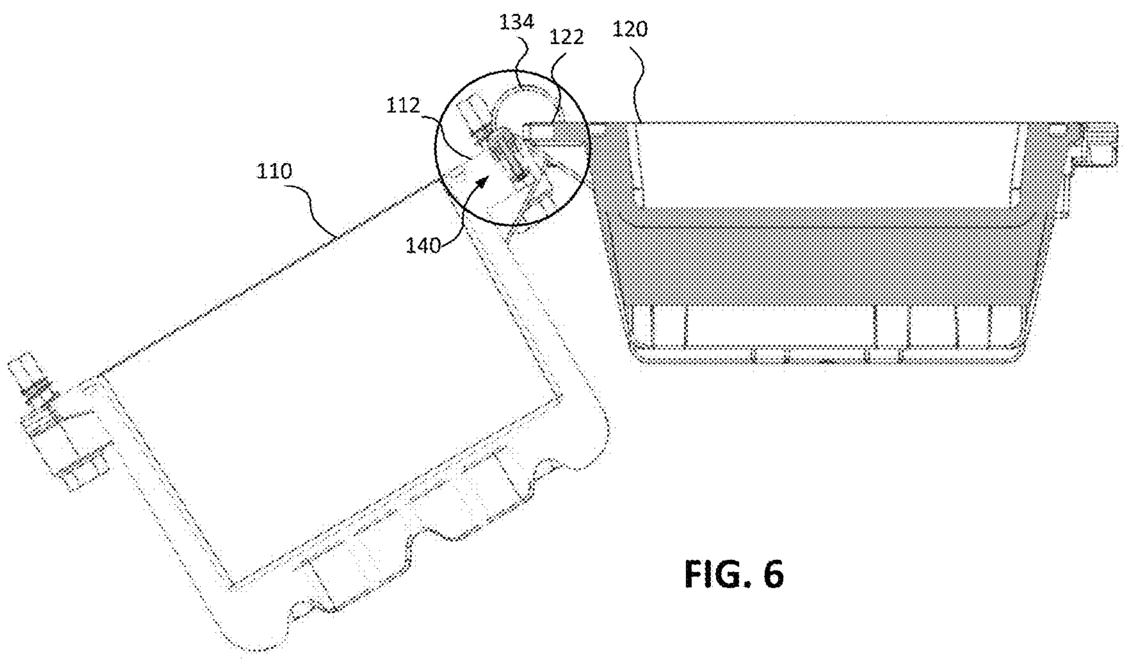
FIG. 6
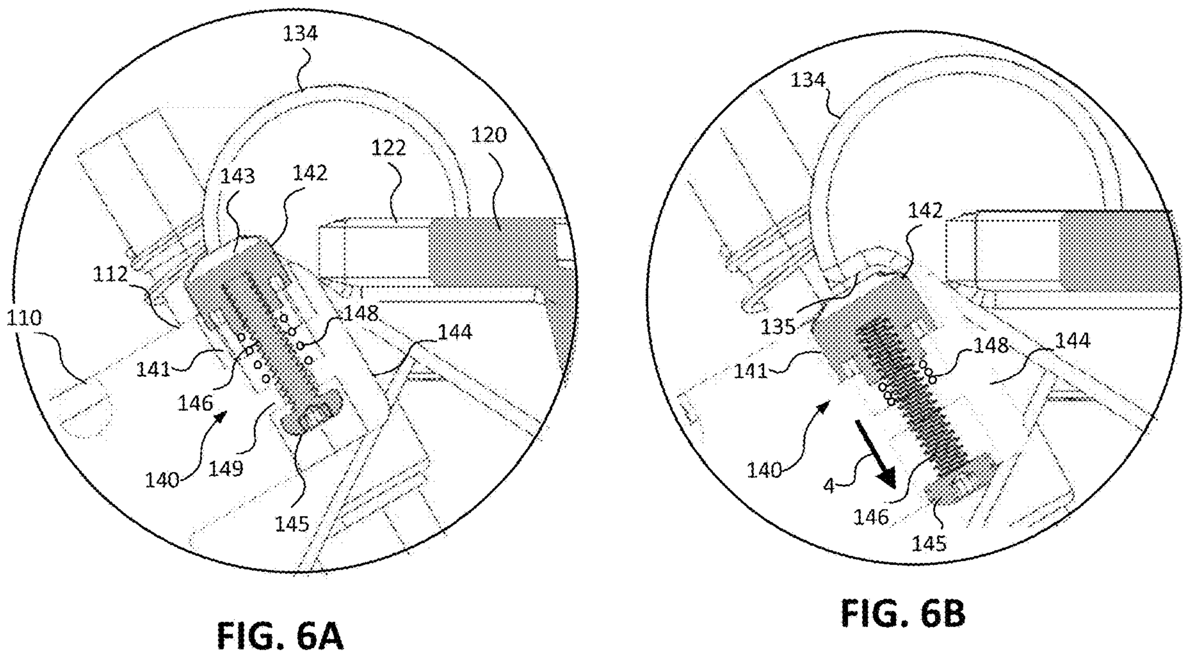
FIG. 6A
FIG. 6B

HINGED HOUSING INCLUDING A HINGE RETENTION MECHANISM

TECHNICAL FIELD

The present disclosure relates to hinged housings for electronic devices and more particularly, to a hinged housing including a hinge retention mechanism for an outdoor electronic device, such as a hybrid fiber-coaxial (HFC) network component.

BACKGROUND INFORMATION

Electronic devices are often used in outdoor environments, such as in a hybrid fiber-coaxial (HFC) network delivering CATV services to subscriber locations. In such devices, electronic components are accommodated inside a housing designed to protect the electronic components from environmental conditions. The housing generally includes a main housing portion and a hinged lid portion that allows access to the components inside the housing. The electronic components may be located in both the main housing portion and the hinged lid portion.

The lid portion is generally designed to be removed from the main housing portion, for example, to allow the lid portion and/or the components located in the lid portion to be upgraded, replaced and/or repaired. The hinge assembly is designed to allow such removal but also designed to prevent inadvertent removal. Existing housings may use a set screw, e-ring, or r-clip on the hinge pin to prevent the lid portion from accidentally falling off when the lid is opened to the widest angle. Such screws, rings, and clips, however, must be removed and are easily dropped and are also susceptible to bending or breaking.

SUMMARY

Consistent with an aspect of the present disclosure, an electronic device housing includes a first housing portion and a second housing portion. The first housing portion includes at least a first hinge member disposed on the first housing portion proximate a rim of the first housing portion. The first housing portion further includes a retention mechanism disposed on the first housing portion proximate the rim and spaced from the first hinge member. The second housing portion includes at least a second hinge member disposed on the second housing portion proximate a rim of the second housing portion. The second hinge member is configured to mate with the first hinge member when positioned in a space between the first hinge member and the retention mechanism. The retention mechanism is retractable and push-activated to allow the second hinge member to pass over the retention mechanism such that the retention mechanism releasably holds the second hinge member in the space.

Consistent with another aspect of the present disclosure, a replacement lid assembly is provided for an RF amplifier housing in a hybrid fiber-coaxial (HFC) network. The replacement lid assembly includes a lid body portion defining at least a first lid chamber for housing electronic components in the RF amplifier housing, a lid rim around the lid body portion, and at least one hinge member disposed on the lid body portion proximate the lid rim and configured to engage a mating hinge member on a base of the RF amplifier housing. The replacement lid assembly also includes a retention mechanism disposed on the lid body portion proximate the lid rim such that the hinge member and the retention mechanism are separated by a space. The retention mechanism is retractable and push-activated to allow the mating hinge member on the base of the RF amplifier to pass over the retention mechanism such that the retention mechanism releasably holds the mating hinge member in the space.

Consistent with a further aspect of the present disclosure, an RF amplifier housing is provided for use in a hybrid fiber-coaxial (HFC) network. The RF amplifier housing includes a base and a lid hingedly coupled to the base. The base includes a base body portion defining a base chamber for housing electronic components, a base rim extending around the base body portion, and at least one base hinge member disposed on the base body portion proximate the base rim. The lid includes a lid body portion defining at least a first lid chamber for housing electronic components, a lid rim extending around the lid body portion, and at least one lid hinge member disposed on the lid body portion proximate the lid rim. The base hinge member and the lid hinge member mate to hingedly couple the base and the lid. The lid further includes a retention mechanism disposed on the lid body portion proximate the lid rim and spaced from the at least one lid hinge member by a space such that the base hinge member is located in the space between the lid hinge member and the retention mechanism. The retention mechanism is retractable and push-activated to allow the base hinge member to pass over the retention mechanism such that the retention mechanism releasably holds the base hinge member in the space.

BRIEF DESCRIPTION OF THE DRAWINGS

These and other features and advantages will be better understood by reading the following detailed description, taken together with the drawings wherein:

FIG. 6 is a cross-sectional view of the hinged housing with the hinge assembly and the hinge retention mechanism in the coupled position taken along line 6-6 in FIG. 5.

FIG. 6A is a close-up cross-sectional view of the hinge assembly and the hinge retention mechanism in an extended position.

FIG. 6B is a close-up cross-sectional view of the hinge assembly and the hinge retention mechanism in a depressed position.

DETAILED DESCRIPTION

A hinged housing with a hinge retention mechanism, consistent with embodiments of the present disclosure, may be used to house electronic equipment such as an RF amplifier in a hybrid fiber-coaxial (HFC) network delivering CATV services to subscriber locations. The hinged housing includes housing portions that may be separated by uncoupling hinge members forming one or more hinge assemblies, for example, to replace, repair or upgrade the electronic equipment. The hinge retention mechanism prevents inadvertent uncoupling of the hinge members and separation of the housing portions. The hinge retention mechanism is retractable and push-activated to allow the hinge members to uncouple while the retention mechanism remains captive and secured to one of the housing portions. In one embodiment, the retention mechanism may be provided on a replacement lid assembly of an electronic equipment housing (e.g., an RF amplifier housing), which is designed to replace a lid assembly on an existing housing in the field. The replacement lid assembly is configured to fit and cover an existing base of the electronic equipment housing, such as an RF amplifier housing, without disconnecting the electronic device (e.g., without interrupting CATV service).

The term "coupled" as used herein refers to any connection, coupling, link or the like between elements. Such "coupled" elements are not necessarily directly connected to one another and may be separated by intermediate components. The term "hingedly coupled" refers to elements that are coupled such that the elements are capable of rotating or moving with a hinging motion relative to each other.

Figure 1:
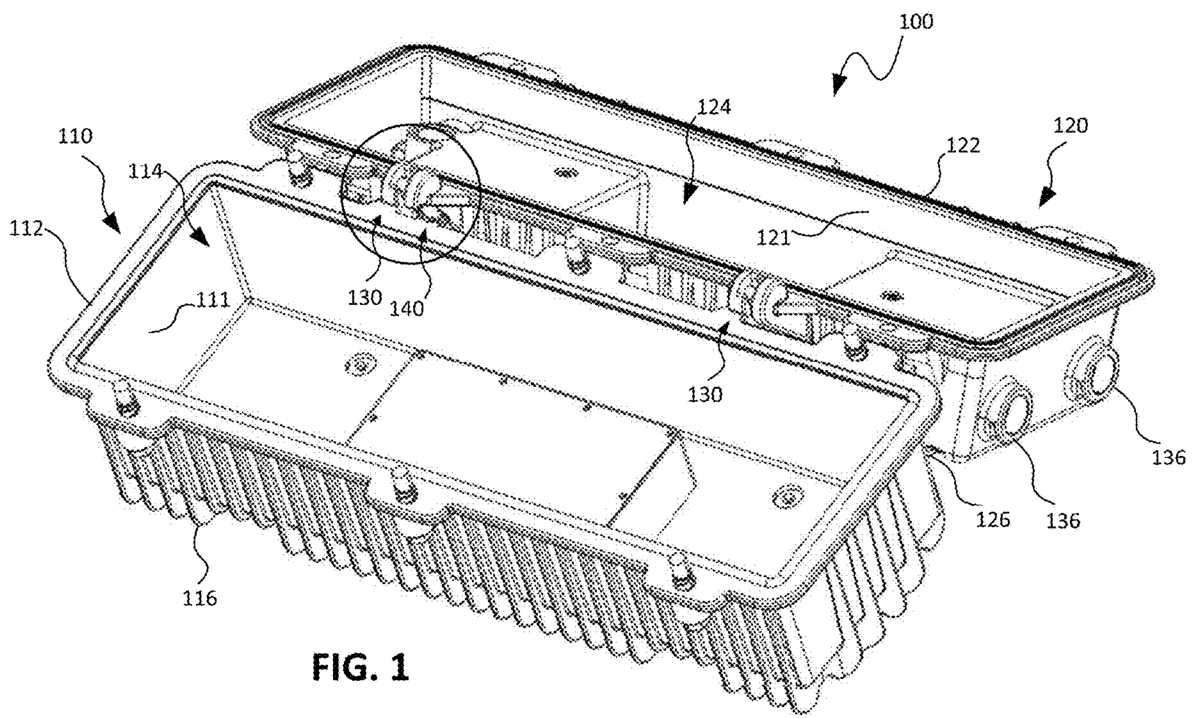
FIG. 1 is a perspective view of a hinged housing including a hinge retention mechanism, consistent with embodiments of the present disclosure.
Figure 1A:
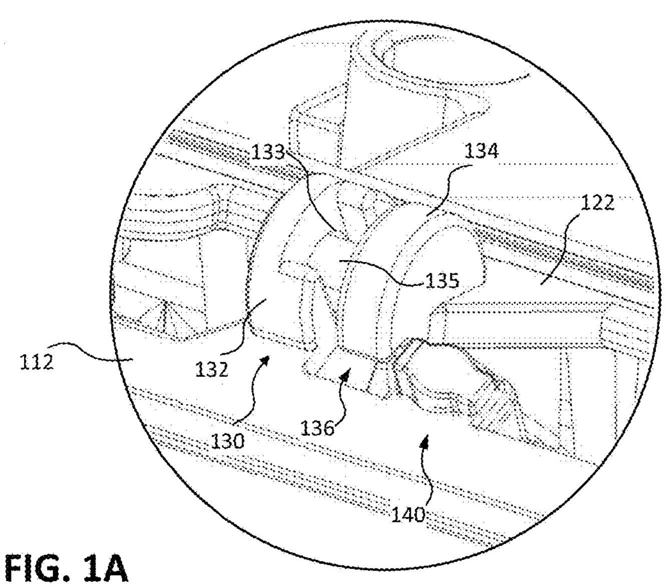
FIG. 1A is a close up view of a hinge assembly and the hinge retention mechanism in FIG. 1.

Referring to FIGS. 1 and 1A, a hinged housing 100 including first and second housing portions 110, 120, one or more hinge assemblies 130, and a hinge retention mechanism 140, consistent with embodiments of the present disclosure, is shown and described in greater detail. In the illustrated embodiment, the housing portions 110, 120 are hingedly coupled by the hinge assemblies 130, thereby forming a clamshell configuration. The hinged housing 100 may be used to house electronic equipment, for example, by including electronic components in one or both of the housing portions 110, 120. Although the illustrated embodiment of the hinged housing 100 includes two hinge assemblies 130 and one hinge retention mechanism 140, other variations are within the scope of the present disclosure.

The first housing portion 110 includes a first body portion 111 that defines one or more chambers 114 and a first rim 112 extending around the first body portion 111. The second housing portion 120 includes a second body portion 121 that defines one or more chambers 124 and a second rim 122 extending around the second body portion 121. Gaskets may be provided in one or both of the first and second rims 112, 122 for sealing the housing 100 when closed, for example, to allow the hinged housing 100 to be used in an outside environment. The first and second body portions 111, 121 of the housing 100 may also include heat transfer fins 116, 126 on an outside of the body portions 111, 121 for transferring heat away from the electronic equipment contained therein. The housing portions 110, 120 may be made of aluminum (e.g., allow 360 or 413) and the hinge members 132, 134 may be formed as one piece with the housing portions 110, 120.

In some embodiments, the hinged housing 100 may house an RF amplifier in an HFC network delivering CATV services to subscriber locations. In such embodiments, the first housing portion 110 may be a lid defining a lid chamber 114 for housing electronic components and the second housing portion 120 may be a base defining a base chamber 124 for housing electronic components and covered by the lid. The base housing portion 120 may contain amplifier circuitry (not shown) at least partially disposed in the chamber 124 defined by the body portion 121. The illustrated embodiment of the base housing portion 120 also includes connector ports 136 extending from the body portion 121 and configured to connect to cables (not shown), such as coaxial cables, carrying RF signals. The lid housing portion 110 may be configured to replace older lid assemblies in existing housings in the field (e.g., when upgrading RF amplifiers to 1.8 GHz) without disconnecting the electronics in the base, which may avoid disruption of CATV services when repairing or updating an HFC network device.

As shown in greater detail in FIG. 1A, the hinge assembly 130 may include a first hinge member 132 disposed on the first housing portion 110 proximate the first rim 112 of the first housing portion 110 and a mating second hinge member 134 disposed on second housing portion 120 proximate the second rim 122 of the second housing portion 120. The hinge retention mechanism 140 prevents the second hinge member 134 from sliding out of engagement with the first hinge member 132 to an uncoupled position, as will be described in greater detail below. In the illustrated embodiment, a hinge pin 135 extending from the second hinge member 134 is received in a hinge aperture 133 defined by the first hinge member 132 such that the hinge pin 135 freely rotates within the hinge aperture 133 to allow the hinging motion. The hinge members 132, 134 have an arcuate shape to allow the hinge members 132, 134 to have adequate clearance relative to the housing portions 110, 120, thereby allowing the hinging motion. The hinge members 132, 134 may also have other shapes and/or configurations, for example, a hinge pin may extend from the first hinge member 132 into an aperture defined by the second hinge member 134.

Figures 2, 3:
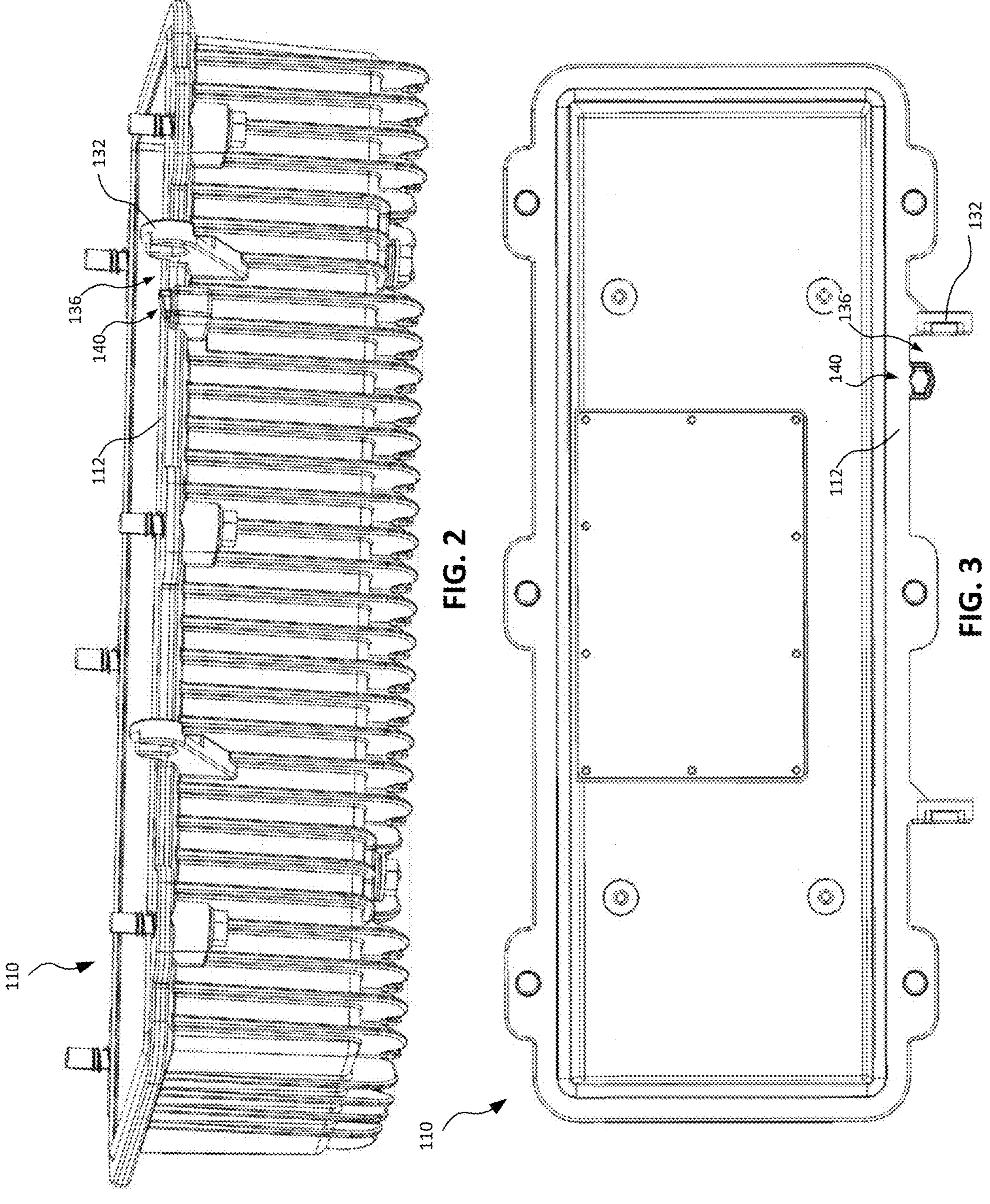
FIG. 2 is a perspective view of the housing portion including the hinge retention mechanism from the hinged housing shown in FIG. 1.
FIG. 3 is plan view of the housing portion shown in FIG. 2.

FIGS. 2 and 3 show the first housing portion 110 (e.g., the lid assembly) in greater detail. As shown in FIGS. 2 and 3, the hinge member 132 and the hinge retention mechanism 140 are disposed on the first housing portion 110 proximate the rim 112 with the hinge retention mechanism 140 spaced from the hinge member 132 by a space 136. When engaged with the second housing portion 120, the second hinge member 134 is located in the space 136 and held in the space 136 by the hinge retention mechanism 140 (see FIG. 1A).

Figures 4, 4A, 5, 5A:
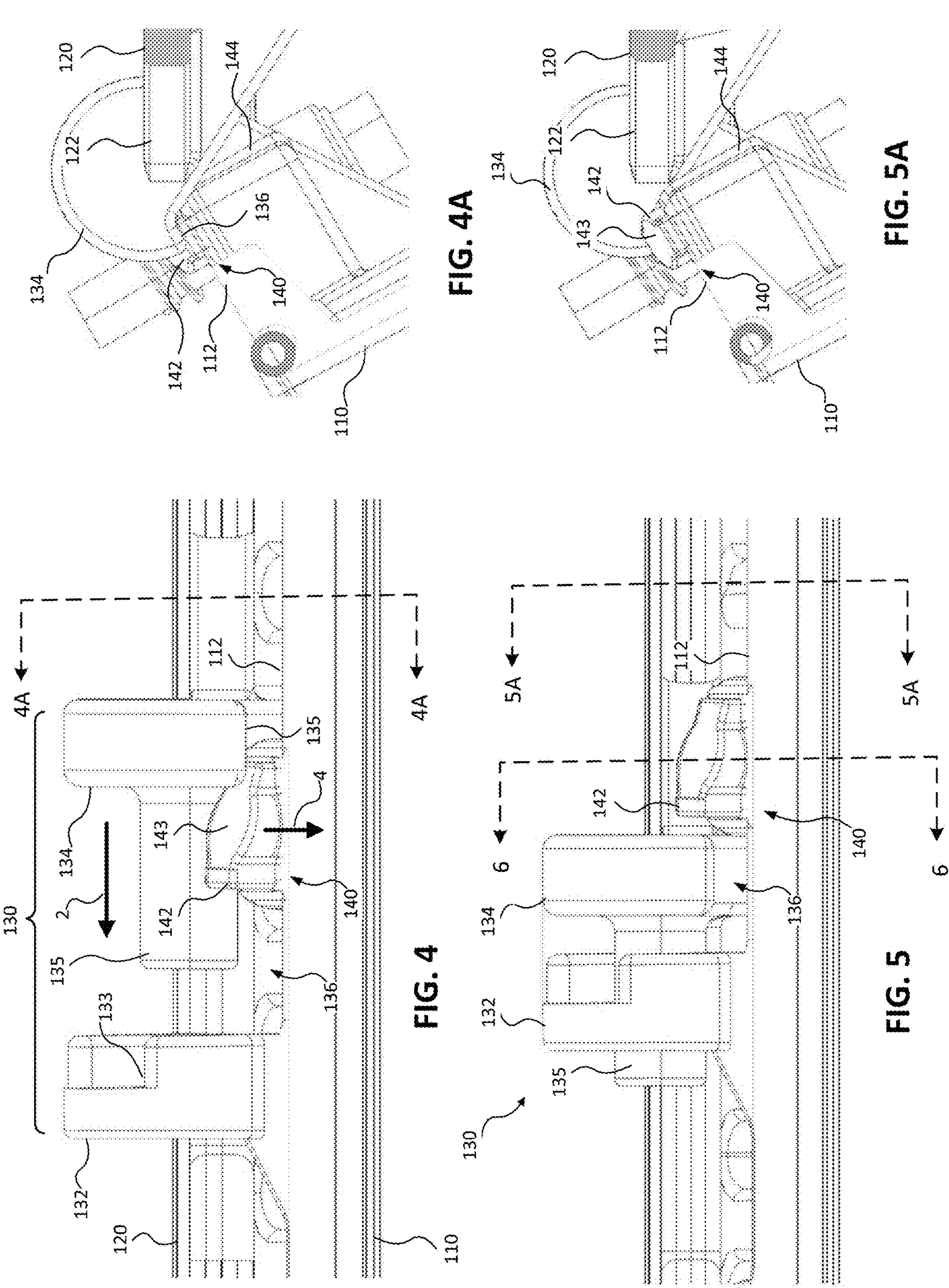
FIG. 4 is a close up side view of the hinge assembly and the hinge retention mechanism with the housing portions in an uncoupled position.
FIG. 4A is a cross-sectional view of the hinged housing in the uncoupled position taken along line 4A-4A in FIG. 4.
FIG. 5 is a close up side view of the hinge assembly and the hinge retention mechanism with the housing portions in a coupled position.
FIG. 5A is a cross-sectional view of the hinged housing in the coupled position taken along line 5A-5A in FIG. 5.

Referring to FIGS. 4, 4A, 5, and 5A, coupling of the hinge assembly 130 and operation of the hinge retention mechanism 140 is described in greater detail. FIGS. 4 and 4A show the hinge assembly 130 in an uncoupled position and FIGS. 5 and 5A show the hinge assembly 130 in a coupled position.

In an embodiment, the hinge retention mechanism 140 includes a catch member 142 slidably received in a mounting portion 144 disposed on the housing portion 110 proximate the rim 112. The catch member 142 may be made of plastic or metal, such as the same aluminum used for the housing portions. The catch member 142 is spring-biased to an extended position and retracts into the mounting portion 144 when push activated to a depressed position. A cam surface 135 on the second hinge member 134 engages an angled face 143 of the catch member 142 as the second hinge member 134 moves in the direction of arrow 2 (FIGS. 4 and 4A) to the coupled position where the hinge pin 135 is inserted into the hinge aperture 133 and the second hinge member 134 is retained in the space 136 (FIGS. 5 and 5A). As the cam surface 135 engages the angled face 143, the second hinge member 134 forces the catch member 142 downward in the direction of arrow 4 to the depressed position. When the second hinge member 134 moves into the space 136, the catch member 142 moves upward to the extended position and retains the second hinge member 134, as shown in FIGS. 5 and 5A. The angled face 143 of the retention mechanism 140 thus allows the retention mechanism 140 to self-actuate when the housing portions 110, 120 are coupled.

In one embodiment, the hinge assembly 130 is designed to only allow uncoupling when the housing portions 110, 120 are opened to a predetermined disengagement position, for example, beyond 180°. The cam surface 135 of the second hinge member 134 is capable of passing over the depressed retention mechanism 140 only when opened to the disengagement position. When the housing portions 110, 120 are not opened to this disengagement position, the mounting structure 144 blocks the second hinge member 134 and prevents movement either from the coupled to the uncoupled position or from the uncoupled to the coupled position. FIGS. 4, 4A, 5, and 5A show the housing portions 110, 120 in this disengagement position where the cam surface 135 is capable of passing over the retention mechanism 140 when the retention mechanism 140 is moved to the depressed position, although the retention mechanism 140 is shown in the extended position.

Figure 7:
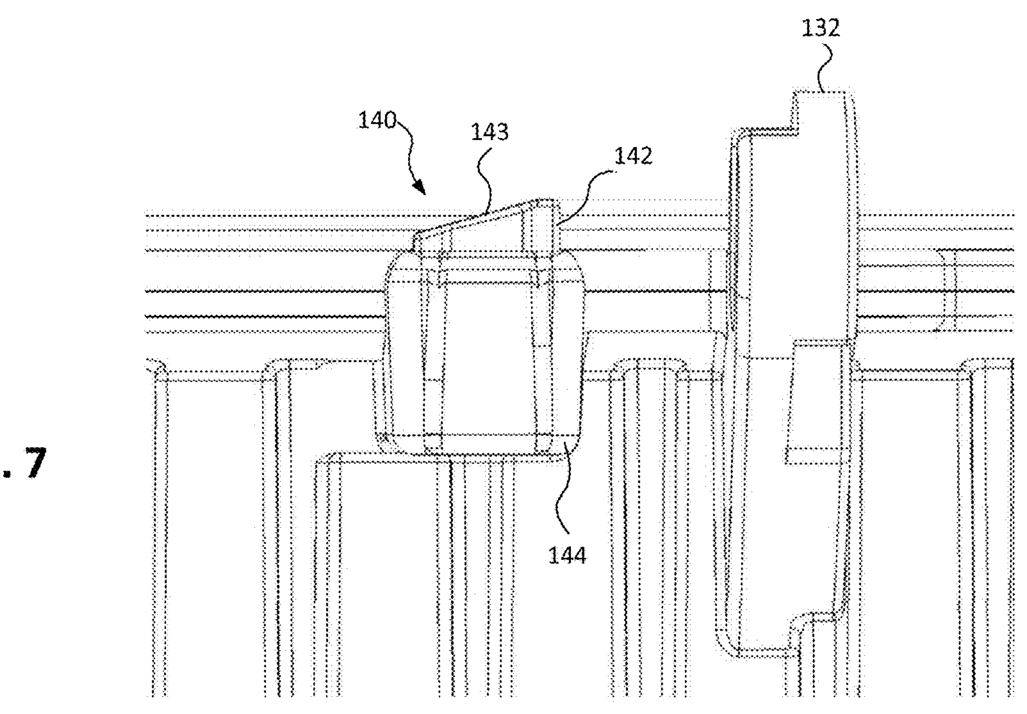
FIG. 7 is a close-up side view of the hinge retention mechanism.
Figure 8:
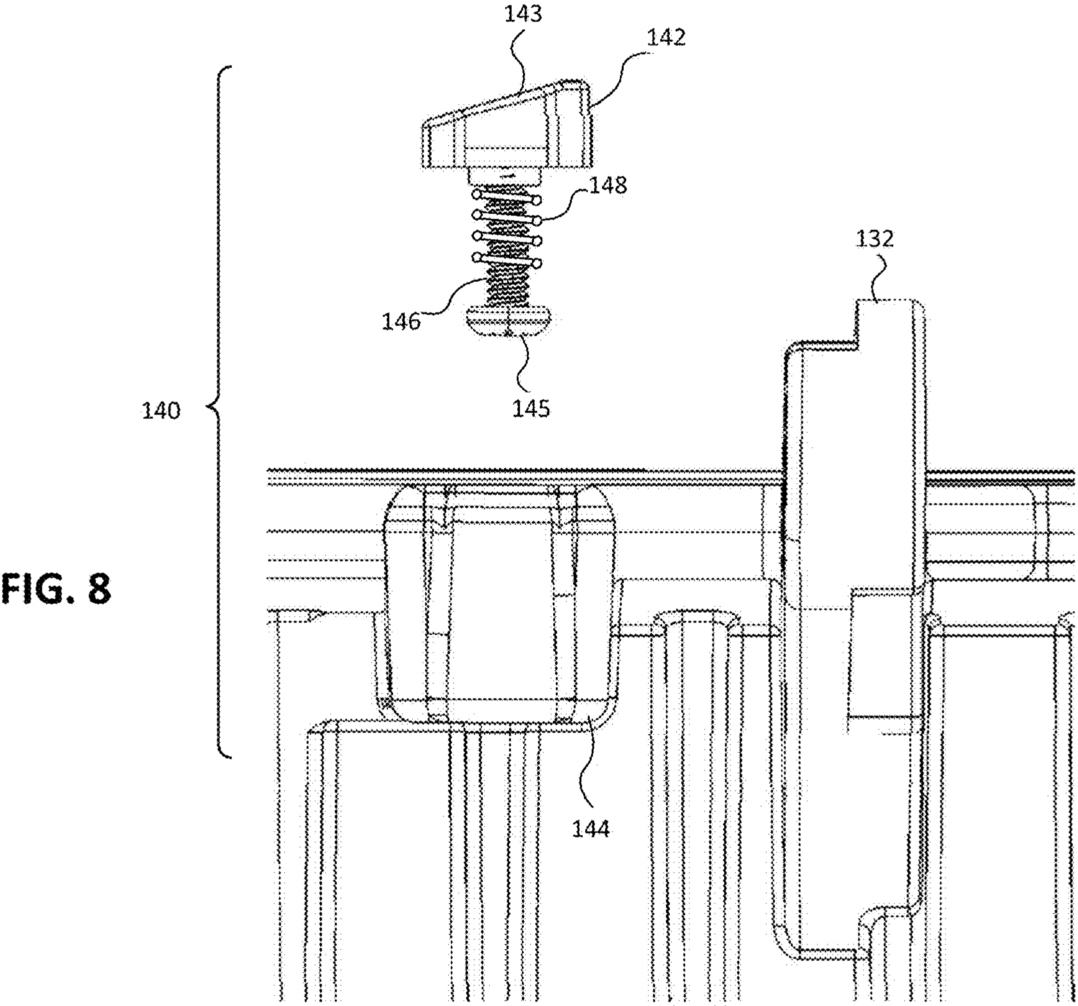
FIG. 8 is an exploded side view of the hinge retention mechanism.

Referring to FIGS. 6-8, an embodiment of the hinge mechanism 140 is described in greater detail. In this embodiment, the hinge retention mechanism 140 includes a post 146 extending from the catch member 142 and a biasing element 148 that biases the catch member 142 to the extended position (FIG. 6A). Although the biasing element 148 is shown as a spring around the post 146, other biasing elements capable of biasing the catch member 142 may also be used. The catch member 142, post 146 and biasing element 148 are received in a space 141 defined by the mounting portion 144 disposed on first housing portion 110 proximate the rim 112. The space 141 defined by the mounting structure 144 has a depth that allows the catch member 142 to be pushed into the space 141 in the depressed position (FIG. 6B).

A head 145 at the end of the post 146 engages a flange 149 inside the mounting portion 144 such that the head 145 and the post 146 hold the catch member 142 captive in the mounting portion 144 and secures the retention mechanism to the first housing portion 110. In one example, the post 146 is a threaded bolt or screw that passes through a hole inside of the mounting portion 144 and is threaded into the catch member 142.

As shown in FIG. 6A, the biasing element 148 biases the catch member 142 to the extended position where the catch member 142 retains the second hinge member 134 in the coupled position. As shown in FIG. 6B, depressing or pushing down on the catch member 142 against the force of the biasing element 148 moves the catch member 142 in the direction of arrow 4 to the depressed position and allows the cam surface 135 of the second hinge member 134 to pass over the catch member 142 to the uncoupled position. In either position, the retention mechanism 140 is held captive in the mounting structure 144 and does not need to be removed from the housing portion 110.

FIGS. 9, 9A, 9B, 10 and 10B show a hinged housing 900 in a closed configuration and including another embodiment of the hinge retention mechanism 940, consistent with the present disclosure. Similar to the embodiment described above, the hinged housing 900 includes housing portions 910, 920 (e.g., a lid and a base), one or more hinge assemblies 930, and a hinge retention mechanism 940. As discussed above, the hinge assembly 930 includes mating hinge members 932, 934 and the hinge retention mechanism 940 is disposed on the first housing portion 910 (e.g., the lid) spaced from the hinge member 932 on the first housing portion 910 such that the hinge member 934 on the second housing portion 920 is retained in the space by the retention mechanism 940.

Figure 9:
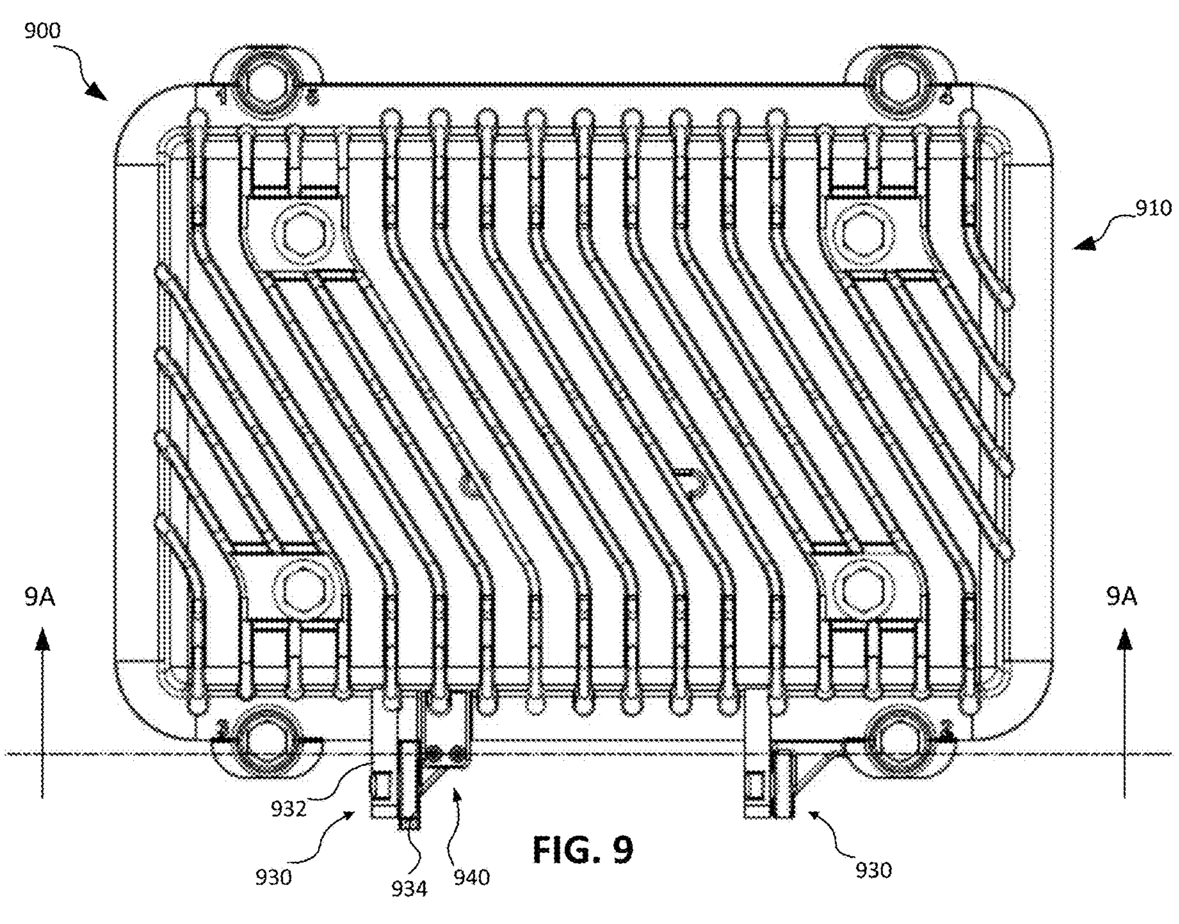
FIG. 9 is a plan view of a hinged housing in a closed configuration including a hinge retention mechanism, consistent with another embodiment of the present disclosure.
Figure 9A:
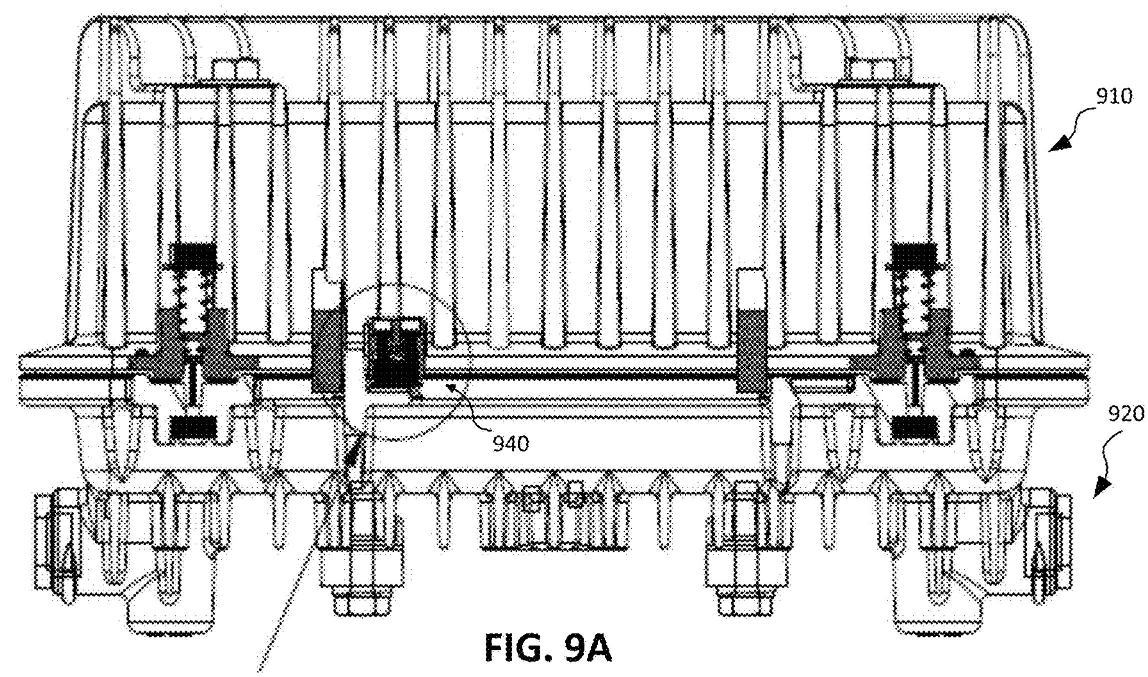
FIG. 9A is a cross-sectional view of the hinged housing in FIG. 9 taken along line 9A-9A.
Figure 9B:
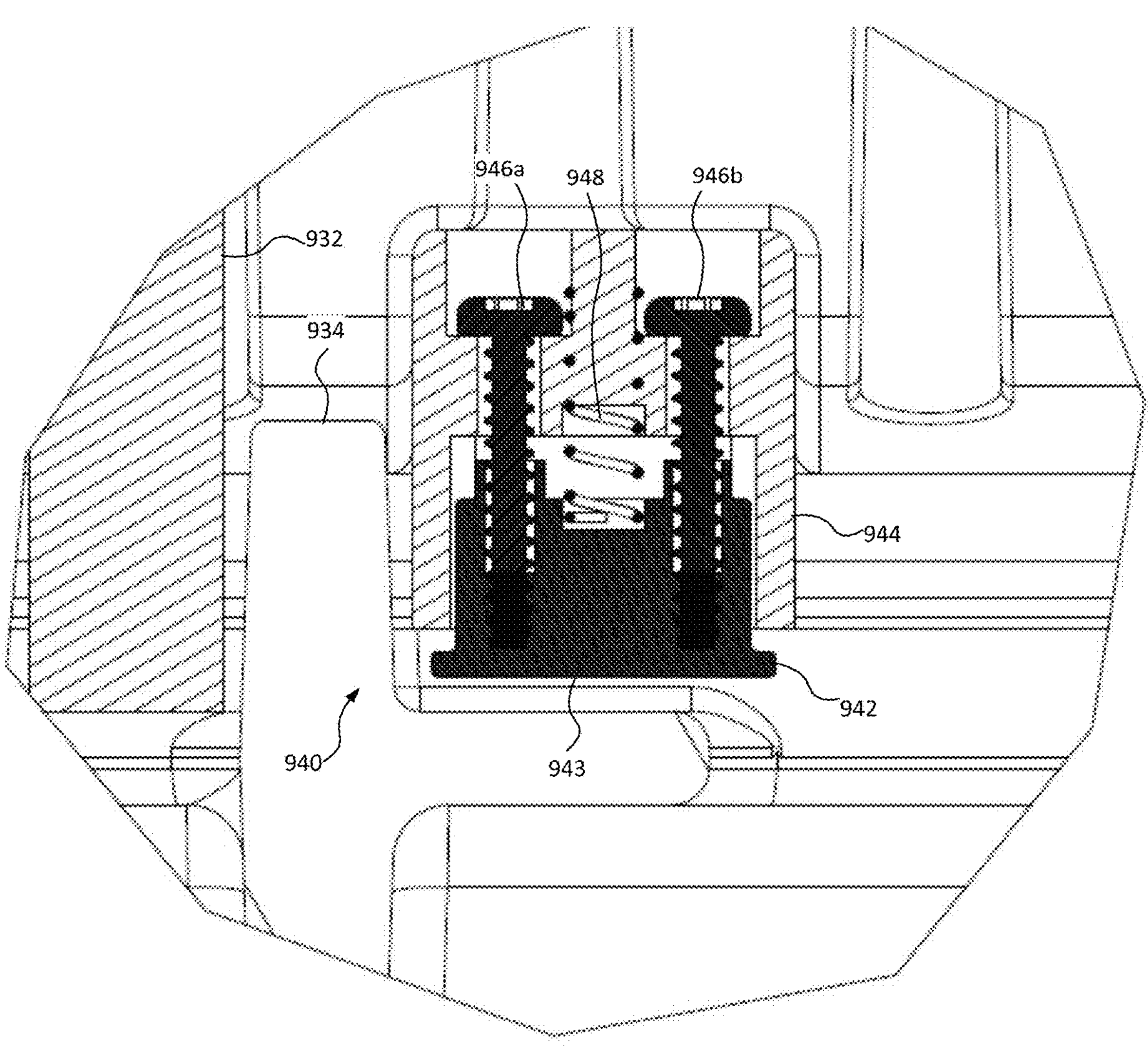
FIG. 9B is a close-up cross-sectional view of the rejection mechanism in the hinged housing of FIG. 9 taken along line 9A-9A.
Figure 10:
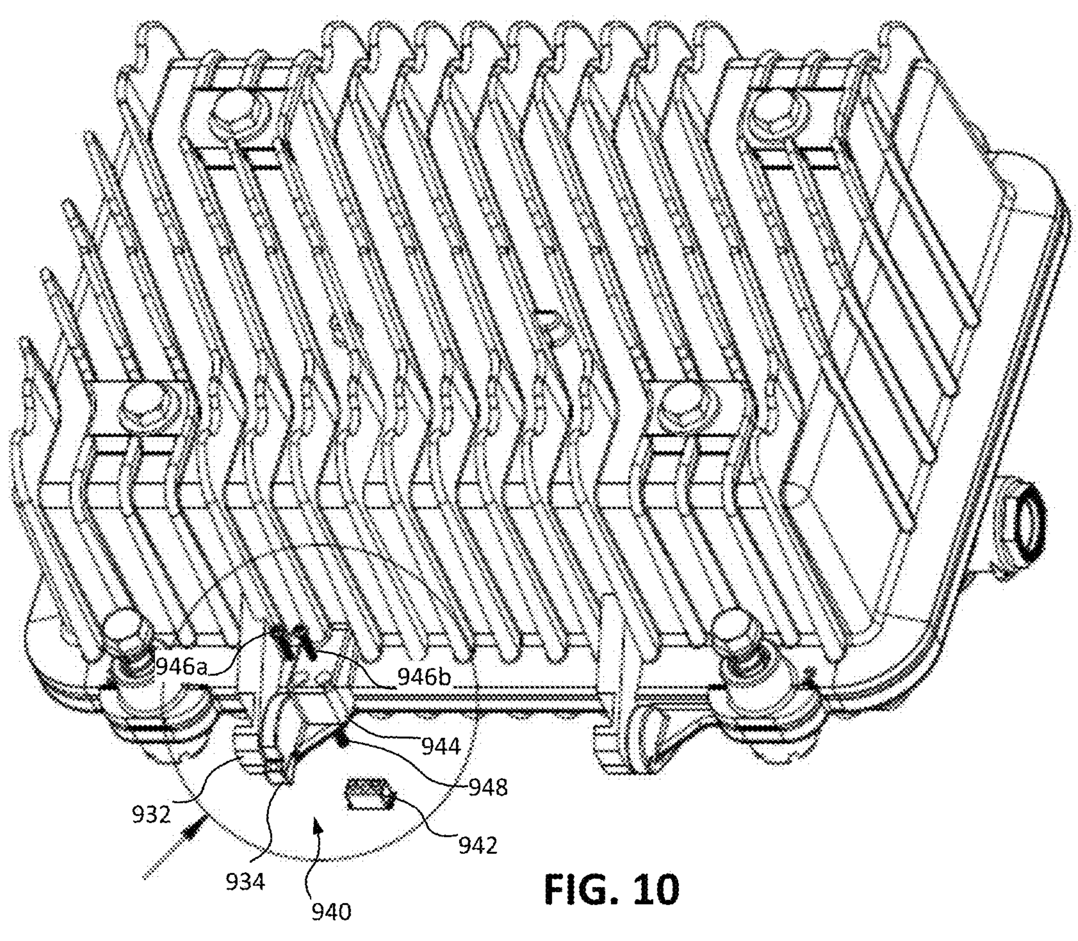
FIG. 10 is an exploded view of the retention mechanism in the hinged housing of FIG. 9.
Figure 10A:
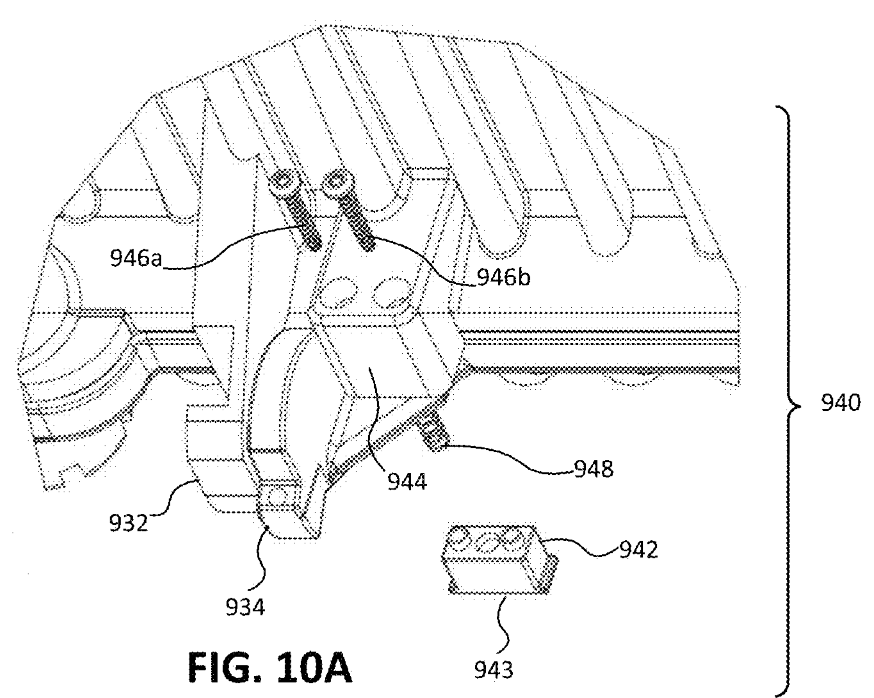
FIG. 10A is a close-up exploded view of the retention mechanism shown in FIG. 10.

As shown in FIG. 9B, the hinge retention mechanism 940 includes a catch member 942 held captive in a mounting structure 944 by posts 946*a*, 946*b* (e.g., threaded bolts or screws) with a biasing element 948 (e.g., a helical spring) disposed between the posts 946*a*, 946*b*. The catch member 942 retains the hinge member 934 in the space and in the coupled position with the mating hinge member 932. The posts 946*a*, 946*b* may be threaded bolts or screws that pass through the mounting structure 944 and are threaded into the catch member 942, similar to the embodiment described above. This embodiment with the biasing element 948 centered between two posts 946*a*, 946*b* may provide smoother operation when the retention mechanism 940 moves between the expanded and depressed positions. In this embodiment, the catch member 942 includes a top face 943 that is flat (i.e., not angled). The catch member 942 with the flat top face 943 is generally symmetric, which prevents installation in the wrong orientation.

Accordingly, the hinge retention mechanism, consistent with embodiments of the present disclosure, retains hinged housing portions in a hinged configuration and is push-activated to release the housing portions from the hinged configuration without having to remove the retention mechanism. The hinge retention mechanism may be used on a replacement lid assembly, for example, which replaces existing lid assemblies to upgrade existing outdoor electronic devices, such as RF amplifiers in an HFC network, without interrupting service.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. An electronic device housing comprising:

a first housing portion including at least a first hinge member disposed on the first housing portion proximate a rim of the first housing portion, the first housing portion further including a hinge retention mechanism disposed on the first housing portion proximate the rim and spaced from the first hinge member; and a second housing portion including at least a second hinge member disposed on the second housing portion proximate a rim of the second housing portion, wherein the second hinge member is configured to mate with the first hinge member when positioned in a space between the first hinge member and the hinge retention mechanism, and wherein the hinge retention mechanism is retractable and push-activated to allow the second hinge member to pass over the hinge retention mechanism such that the hinge retention mechanism releasably holds the second hinge member in the space; wherein the hinge retention mechanism includes a catch member slidably received in a mounting structure disposed on the first housing portion and movable between an extended position and a depressed position, at least one post extending from the catch member into the mounting structure, and a spring for biasing the catch member to the extended position, wherein the catch member holds the second hinge member in the space, and wherein the at least one post moves with the catch member and holds the catch member captive in the mounting structure.

2. The electronic device housing of claim 1, wherein the first housing portion is a lid, and the second housing portion is a base.

3. The electronic device housing of claim 1, wherein the first housing portion and the second housing portion are both configured to house electronic components.

4. The electronic device housing of claim 1, wherein the first hinge member defines a hinge aperture, and wherein the second hinge member includes a hinge pin configured to be received in the hinge aperture.

5. The electronic device housing of claim 1, wherein the first housing portion includes a third hinge member disposed on the first housing portion proximate the rim of the first housing portion, and wherein the second housing portion includes a fourth hinge member disposed on the second housing portion proximate a rim of the second housing portion, wherein the fourth hinge member is configured to mate with the third hinge member when the first and second housing portions are hingedly coupled.

6. The electronic device housing of claim 1, wherein the hinge retention mechanism includes first and second posts and the spring member is located between the first and second posts.

7. The electronic device housing of claim 6, wherein the catch member includes a flat top face.

* * * * *